United States Patent [19]

Vest

[11] 4,451,693

[45] May 29, 1984

[54] COMBINED BALLAST CONTAINER AND WALL PLUG FOR PORTABLE ELECTRICAL EQUIPMENT

[76] Inventor: Gary W. Vest, 4480 Broadview Rd., Cleveland, Ohio 44109

[21] Appl. No.: 360,408

[22] Filed: Mar. 22, 1982

[51] Int. Cl.³ ............................................. H05K 5/00
[52] U.S. Cl. .......................... 174/52 R; 174/DIG. 2; 336/90; 336/107
[58] Field of Search ....................... 174/48, 53, 66, 67, 174/DIG. 2, 52 R, 51; 336/92, 107; 339/122 R, 122 F, 123

[56] References Cited

U.S. PATENT DOCUMENTS

| Re. 28,499 | 7/1975 | Flentge | 336/92 |
|---|---|---|---|
| 2,583,353 | 1/1952 | Bishofberger | 336/67 |
| 2,939,095 | 5/1960 | Chertok | 174/52 PE X |
| 2,988,617 | 6/1961 | Graziosi | 337/197 |
| 3,255,399 | 6/1966 | Parks | 363/146 |
| 3,387,244 | 6/1968 | Davis | 336/92 |
| 3,391,384 | 7/1968 | Hughes | 339/196 R |
| 3,403,366 | 9/1968 | Klatte et al. | 336/92 |
| 3,889,132 | 6/1975 | Vreeland | 174/53 X |
| 4,001,527 | 1/1977 | Hulshizer | 174/53 X |
| 4,028,654 | 6/1977 | Bullard et al. | 336/92 |
| 4,092,706 | 5/1978 | Vest | 362/390 |
| 4,107,636 | 8/1978 | DiGirolamo | 336/92 |

*Primary Examiner*—R. L. Moses
*Assistant Examiner*—D. A. Tone
*Attorney, Agent, or Firm*—Pearne, Gordon, Seasions, McCoy, Granger & Tilberry

[57] ABSTRACT

An electrical component and housing module for an electrical appliance circuit, adapted to be plugged into a conventional wall outlet. The module has a base plate and a recessed cover formed of dielectric material and assembled to define a protective enclosure. The base plate has a relatively small, rectangular opening and the cover has walls including at least two opposed walls with ventilation slots. The base plate also has resilient means that cooperates with the slots to anchor the cover to the base. The electrical circuit component is secured in the enclosure, and is connected to the electrical appliance by a conventional power cord that extends through the cover. A wall-plug-type connector with an insulating body and contact prongs is electrically connected to the circuit component and has its contact prongs extending through the opening in the base plate for insertion into a wall outlet. The insulating body of the connector is secured to the base plate within the enclosure by resilient means on the base plate.

7 Claims, 12 Drawing Figures

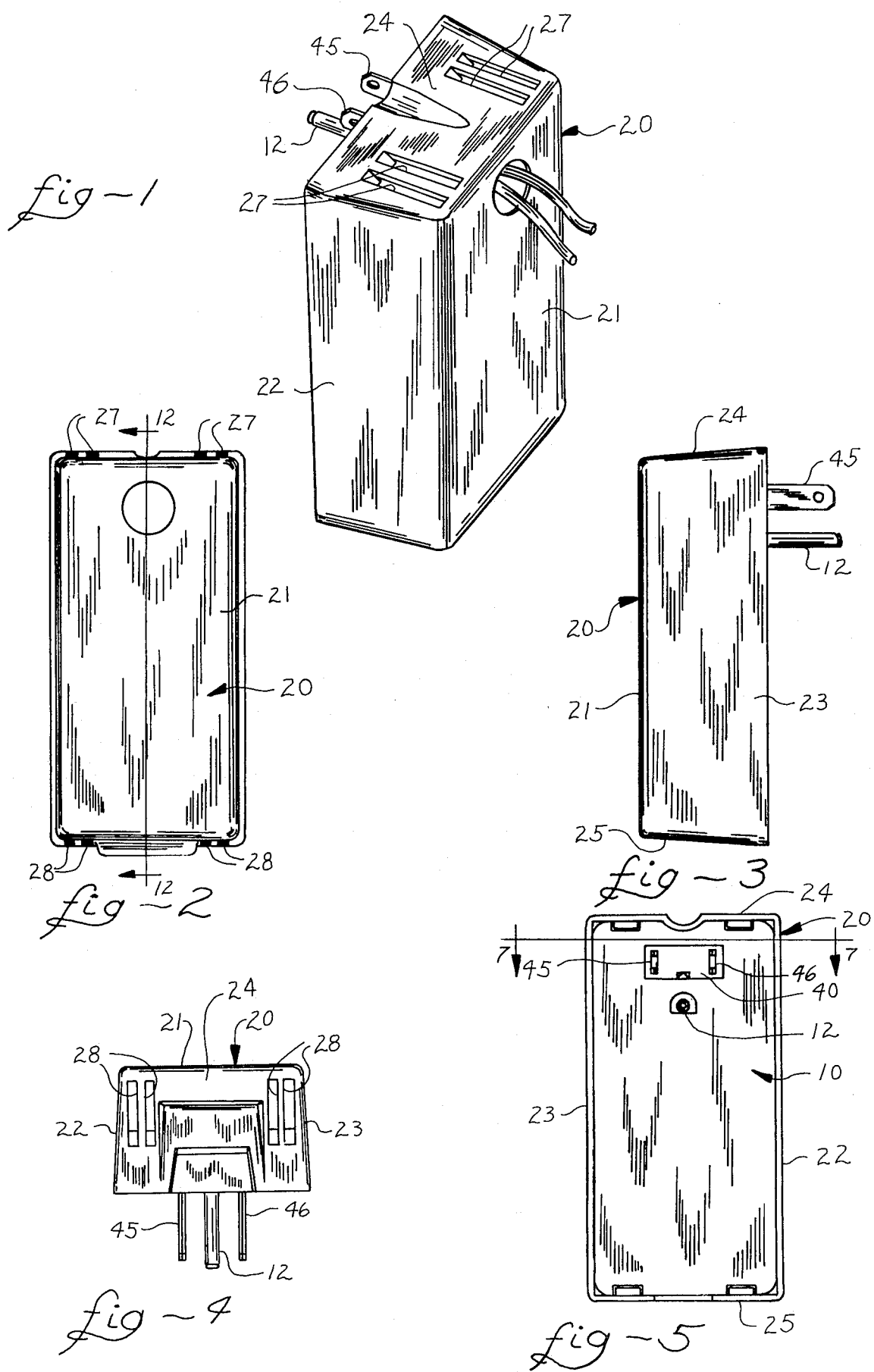

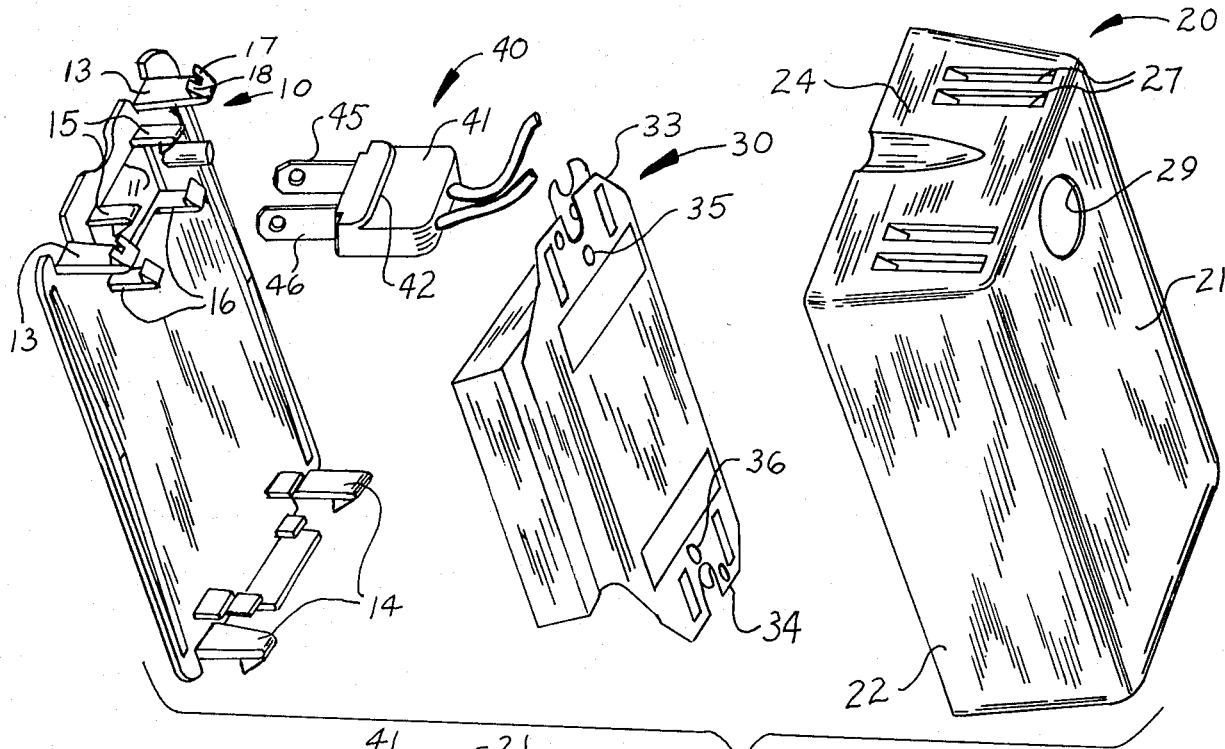
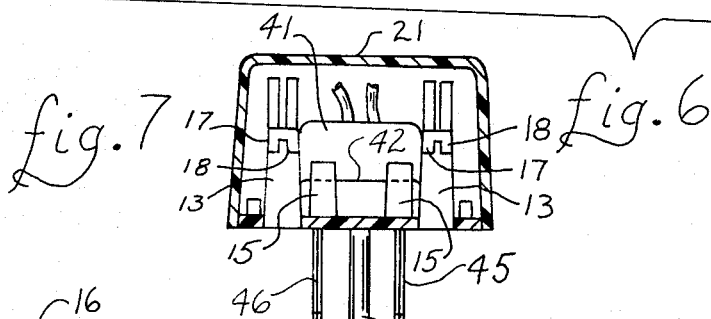
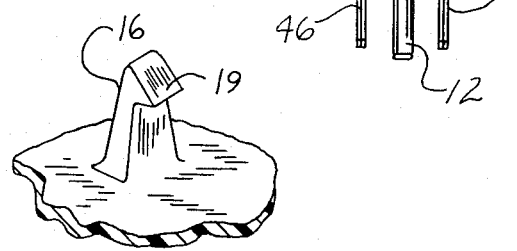
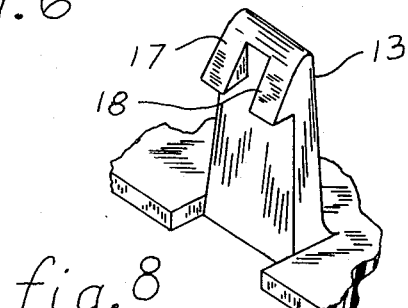
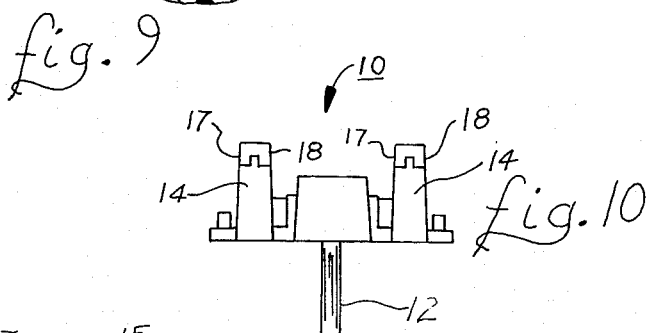
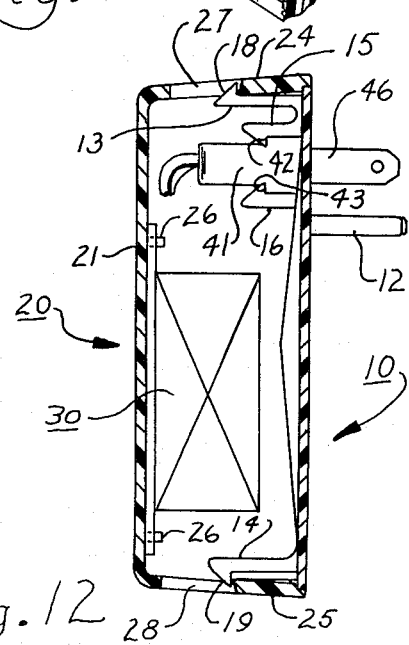
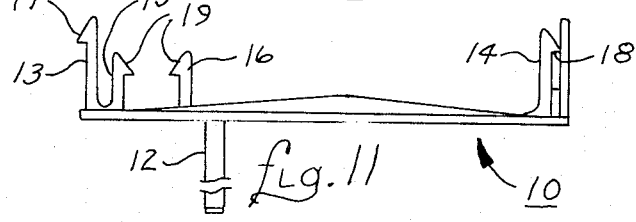
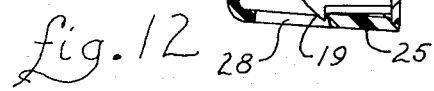

COMBINED BALLAST CONTAINER AND WALL PLUG FOR PORTABLE ELECTRICAL EQUIPMENT

BACKGROUND OF THE INVENTION

This invention relates to circuit components for electrical equipment that utilizes standard electrical power service with conventional wall outlets, and especially to protective enclosures or housings for such circuit components when they are located remotely from the operative unit of the equipment. More particularly, the invention relates to the construction and assembly of such protective enclosures and the association therewith of the wall plug that connects the equipment to a wall outlet forming part of the electrical power service.

Various types of electrical equipment, such as fluorescent light units, require special circuit components such as ballast elements. The most common type of ballast element is a small transformer that provides an inductive load in series with one or more fluorescent tubes. These components are heavy and, in the case of portable equipment such as a portable fluorescent light unit, would add undesirable weight to the unit, all of which would make the equipment difficult to lift and transport.

Examples of portable type fluorescent units that are commonly called "trouble lights" are shown in my U.S. Pat. No. 4,092,706 and in my copending application Ser. No. 111,786, filed Jan. 14, 1980, all of which are incorporated by reference herein and made a part hereof.

Usually prior art equipment of the type described has the ballast transformer or other similar circuit component housed in a protective cover and interposed along the power cord somewhere between the wall plug and the operative equipment. This arrangement has several disadvantages, among which are the awkwardness of handling the power cord with the additional weight of the added component and the vulnerability of the ballast transformer and/or its protective cover to damage.

Where the ballast transformer or the like is located close to the operative components of the portable equipment, the disadvantages are even greater, due to the added weight that reduces the mobility capability of the device.

Other prior art devices have attempted to combine a housing for a circuit component with a wall plug for the respective appliances. Examples of these are shown in the following U.S. Pat. Nos.:

RE 28,499
2,583,353
2,988,617
3,255,399
3,387,244
3,391,384
3,403,366
4,028,654
4,107,636

The electrical component and housing module of the present invention, however, reduces the difficulties described above and affords other features and advantages heretofore not obtainable.

SUMMARY OF THE INVENTION

It is among the objects of the present invention to simplify and improve the safety of remote electrical circuit components for electrical appliance units.

Another object is to provide an improved electrical component and housing module for an electrical appliance circuit.

Still another object is to enable an electrical component and housing module for an electrical appliance circuit to be combined with the wall plug or connector so that the entire assembly may be plugged into a conventional electrical wall outlet.

These and other objects and advantages are achieved with the novel electrical appliance circuit module of the invention, which includes a relatively flat base plate formed of a dielectric material and a cover formed of the same or similar material and having walls that define a plurality of ventilation slots. The cover is adapted for assembly with the base plate to define therewith a protective enclosure in which the electrical circuit component is mounted.

In accordance with the invention, the cover is secured to the base plate by resilient means mounted on the base plate that cooperates with the slots to anchor the cover securely in place. A wall plug-type connector that is electrically connected to the circuit component is positioned with its insulating body located within the enclosure and its contact prongs extending through an opening in the base plate. The connector is anchored to the base plate by resilient means on the base plate adjacent the opening that cooperates with the insulating body to secure the connector tightly in position.

BRIEF DESCRIPTION OF THE DRAWINGS

FIG. 1 is a perspective view of a combined circuit component and housing module embodying the invention;

FIG. 2 is a front elevation of the module of FIG. 1;

FIG. 3 is a side elevation of the module of FIG. 1;

FIG. 4 is a view from below of the module of FIG. 1;

FIG. 5 is a rear elevation of the module of FIG. 1;

FIG. 6 is an exploded, perspective view, illustrating the construction and assembly of the module of FIGS. 1-5;

FIG. 7 is a sectional view taken on the line 7—7 of FIG. 5;

FIG. 8 is a fragmentary, perspective view illustrating one of the resilient latches for connecting the base to the cover of the module;

FIG. 9 is a fragmentary, perspective view illustrating one of the resilient latches for securing the connector plug to the base plate of the module;

FIG. 10 is an end elevation of the base plate used in the module of the invention;

FIG. 11 is a side elevation of the base plate of FIG. 10; and

FIG. 12 is a sectional view taken on the line 12—12 of FIG. 2.

DESCRIPTION OF THE PREFERRED EMBODIMENT

Referring more particularly to the drawings, there is shown an electrical component and housing module A for an electrical appliance circuit such as a portable fluorescent light unit, the module being adapted not only to house a circuit component (in this case, a ballast transformer for the fluorescent tube) but also to be plugged directly into a conventional electrical wall outlet. The module A includes a base plate 10 and a cover 20 formed of a suitable dielectric material, such as a thermosetting plastic, a ballast transformer 30, and a connector plug 40.

The base 10 has a rectangular opening 11 and a rearwardly extending pin 12 adapted to be inserted in the ground socket contact opening of a conventional electrical wall socket. Also, the base plate has four outwardly extending resilient latches, including two upper latches 13 and two lower latches 14, adapted to cooperate with the cover 20 to lock the cover securely to the base plate, as will be described in more detail below. Also, the base plate has four resilient latches located adjacent the rectangular opening 11, including a pair of upper latches 15 and a pair of lower latches 16 adapted to cooperate with the connector plug 40 to securely anchor the connector plug to the base plate 10 in a manner that will also be described in more detail below.

The cover 20 comprises a front wall 21 spaced from and generally parallel to the base plate 10, opposed sidewalls 22 and 23, a top wall 24, and a bottom wall 25. The top wall 24 has four parallel ventilation slots 27 and the bottom wall 25 likewise has four parallel ventilation slots 28.

Within the enclosure defined by the walls 21, 22, 23, 24, and 25 are a pair of locater pins 26 extending rearwardly from the front wall 21.

The ballast transformer 30 includes a mounting plate 31 with upper and lower projections 33 and 34 that define an upper positioning hole 35 and a lower positioning hole 36. When the ballast transformer 30 is placed within the enclosure defined by the cover 20, the locater holes 35 and 36 are aligned with and receive the locater pins 26 to firmly locate the transformer in its proper position.

The base 10 and cover 20 are secured to one another by means of cooperation between the resilient latches 13 and 14 that extend rearwardly from the inner surface of the base 10 and the vent holes 27 and 28 in the top wall 24 and bottom wall 25, respectively, of the cover 20. It will be noted that each of the latches 13 and 14 has two outwardly extending fingers 17 and 18. When the base and cover are assembled and pressed together, the resilient latches 13 and 14 engage the inner surface of the top wall 24 and bottom wall 25, respectively, and are thereby flexed inwardly. As the base 10 and cover 20 are pressed together, the fingers 17 and 18 ultimately snap into the inner ends of the slots 27 and 28 to lock the base and cover to one another as shown in FIG. 8. After assembly, the base and cover may be welded to one another at contact points if desired.

The connector plug 40 has a molded body 41 formed of dielectric material, such as an elastomeric material, and the body 41 has a pair of shoulders 42 and 43 formed on its opposite sides, as best shown in FIG. 6. A pair of contact prongs 45 and 46 of conventional size and spacing extend outwardly from the body 41, and when the connector plug 40 is assembled with the base 10, the contact prongs 45 and 46 extend inwardly through the rectangular opening 11. The molded body 41, however, engages the inner surface of the base at portions adjacent the rectangular opening 11.

It will be noted that the resilient latches 13 and 14 located on opposite sides of the rectangular opening 11 have inwardly projecting fingers 19 that serve to lock the connector plug 40 in position relative to the base 10. As the molded body 41 is pressed toward the opening 11, the shoulder portions 42 and 43 engage the resilient latches 13 and 14, and cause them to flex outwardly. As the connector plug is moved further into position, the latches reach a point extending beyond the shoulders 42 and 43, and snap inwardly so that the fingers 19 grip the shoulders and securely lock the connector plug 40 to the base 10. A pair of conductors extend rearwardly from the molded body 41 and are electrically connected to terminals on the ballast transformer 30 to form part of the electrical circuit for the appliance. A power cord extends through an opening 29 in the front wall 21 of the cover 20, and is connected to another set of terminals on the ballast transformer 30. The power cord may be secured to the cover 21 by means of a grommet or the like that cooperates with the opening 29.

With the construction shown, it will be seen that the ballast transformer 30 and the connector plug 40 are assembled together within a protective enclosure defined by the base and the cover 20 to form a convenient integral module supported in the wall socket that services the electrical appliance. This provides a convenient mechanical positioning of the ballast transformer that eliminates many of the difficulties inherent in prior art constructions, and at the same time assures a high degree of safety as compared with devices of the prior art.

While the invention has been shown and described with respect to a specific embodiment thereof, this is intended for the purpose of illustration rather than limitation, and other modifications and variations of the specific device herein shown and described will be apparent to those skilled in the art all within the intended spirit and scope of the invention. Accordingly, the patent is not to be limited in scope and effect to the specific embodiment herein shown and described, nor in any other way that is inconsistent with the extent to which the progress in the art has been advanced by the invention.

What is claimed is:

1. An electrical component and housing module for an electrical appliance circuit adapted to be plugged into a conventional electrical wall outlet comprising:
   a relatively flat base plate formed of a dielectric material and defining an opening;
   a cover formed of dielectric material and having walls defining a plurality of ventilation slots, said cover being adapted for assembly with said base plate to define therewith a protective enclosure;
   first resilient means on said base plate cooperating with said slots for securing said cover to said base plate;
   an electrical circuit component secured in said enclosure and forming a part of said electrical appliance circuit;
   a wall-plug-type connector electrically connected to said circuit component and having an insulating body located in said enclosure and contact prongs extending through said opening; and
   second resilient means on said base plate adjacent said opening cooperating with said insulating body for securing said connector to said base plate.

2. A module as defined in claim 1, wherein said ventilation slots of said cover are located in at least two of said walls that extend generally outwardly from said base and wherein said first resilient means comprises a plurality of latches extending generally perpendicular to said base plate and adapted to register with said slots and to be flexed by said two walls when said cover and said base plate are brought together until said cover and base plate are finally joined whereupon said latches spring in opposition to said flexing into said slots and thus into gripping engagement with said cover.

3. A module as defined in claim 2, wherein said two walls are located at the top and bottom, respectively, of said cover.

4. A module as defined in claim 1, further including a prong formed integrally with said base and extending from said base parallel to said contact prongs and located relative thereto so as to be insertable into the ground socket contact opening of the wall socket into which said module is to be plugged.

5. A module as defined in claim 1, wherein said electrical circuit component is a ballast transformer for a fluorescent tube.

6. An electrical component and housing module for an electrical appliance circuit adapted to be plugged into a conventional electrical wall outlet comprising:
- a relatively flat base plate formed of a dielectric material and defining an opening;
- a cover formed of a dielectric material and adapted for assembly with said base plate to define therewith a protective enclosure;
- an electrical circuit component secured in said enclosure and forming a part of said electrical appliance circuit;
- a wall-plug-type connector electrically connected to said circuit component and having an insulating body located in said enclosure and contact prongs extending through said opening; and
- a prong formed integrally with said base and extending from said base parallel to said contact prongs and located relative thereto so as to be insertable into the ground socket contact opening of the wall socket into which said module is to be plugged.

7. A module as defined in claim 6, further including resilient means on said base plate adjacent said opening cooperating with said insulating body for securing said connector to said base plate.

* * * * *